(12) United States Patent
Aziz et al.

(10) Patent No.: US 6,204,781 B1
(45) Date of Patent: Mar. 20, 2001

(54) GENERAL RATE N/(N+1) (0, G) CODE CONSTRUCTION FOR DATA CODING

(75) Inventors: Pervez M. Aziz, South Whitehall; Ian M. Hughes, Malvern; Patrick W. Kempsey, Catasauqua; Srinivasan Surendran, Whitehall, all of PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/272,089

(22) Filed: Mar. 18, 1999

(51) Int. Cl.[7] .................................................. H03M 7/00
(52) U.S. Cl. .................................. 341/59; 341/58; 341/61
(58) Field of Search ............................ 341/59, 58, 61; 371/37.1, 42; 714/795

(56) References Cited

U.S. PATENT DOCUMENTS

| | | |
|---|---|---|
| 4,486,739 | 12/1984 | Franaszek et al. . |
| 4,707,681 | 11/1987 | Eggenberger et al. . |
| 5,260,703 | 11/1993 | Nguyen et al. . |
| 5,537,112 | 7/1996 | Tsang . |
| 5,604,497 | 2/1997 | Sonntag . |
| 5,635,933 * | 6/1997 | Fitzpatrick et al. .................... 341/58 |
| 6,046,691 * | 4/2000 | Aziz et al. ............................... 341/58 |

* cited by examiner

Primary Examiner—Brian Young
Assistant Examiner—John Nguyen
(74) Attorney, Agent, or Firm—Ian M. Hughes; Steve Mendelsohn

(57) ABSTRACT

A general rate N/(N+1) (0, G), code construction, e.g., for a magnetic recording system, allows for encoding or decoding of a dataword having N elements, N preferably being an integer multiple of eight. The dataword is divided into N/8 bytes of binary data that are encoded as a run-length limited (RLL) codeword in accordance with the general rate N/(N+1) (0, G) code construction. The general rate N/(N+1) (0, G) code construction is characterized by the constraints (d=0, G=(N/4)+1, l=N/8, r=N/8). the N/(N+1) (0 (N/4)+1, N/8, N/8) RLL codeword is constructed from the dataword in accordance with 1) pivot bits identifying code violations related to the constraints, 2) correction bits set to correct code violations, and 3) preserved elements having values not included in the code violations. The corrections by correction bits correspond to corrections of predefined code violations that limit the number of consecutive zeros received by, for example, a magnetic record channel to (N/4)+1. The codewords generated in accordance with the general rate N/(N+1) (0, G) code construction may exhibit a high transition density. The high transition density allows for more frequent timing and gain control updates, and so results in lower required channel input signal to noise ratio for a given level of magnetic recording channel performance.

38 Claims, 3 Drawing Sheets

FIG. 2A GENERAL CODE CONSTRUCTION (N>16)

|  | | | | | | $z(\frac{N}{2})$ | $z(\frac{N}{2}+1)$ | $z(\frac{N}{2}+2)$ |
|---|---|---|---|---|---|---|---|---|
| ℓ1 ONLY | a(2+G) | a($\frac{N}{2}$) | a($\frac{N}{2}$+1) | 1 | ... a($\frac{N}{2}$-1) | 0 | 0 | 1 |
| CODE VIOLATION | | | | pb1a | | | | |
| NOT ℓ1 ONLY | 1 | a(2) | a(3) | 0 | ... 1 | 0 | 0 | 1 |
| CODE VIOLATION | | | | pb1a | (z(2+G)) | pb1 | pbm | pb2 |

FIG. 2B 16/17(0,5,2,2) CODE CONSTRUCTION

| | | | | | | | | | |
|---|---|---|---|---|---|---|---|---|---|
| ℓ1 ONLY | a(8) | a(9) | 1 | a(4) | a(5) | a(6) | a(7) | 0 | 0 | 1 |
| CODE VIOLATION | | | pb1a | | | | | pb1 | pbm | pb2 |
| NOT ℓ1 ONLY | 1 | a(2) | 0 | a(1) | a(8) | a(9) | 1 | 0 | 0 | 1 |
| CODE VIOLATION | | | pb1a | | | | | pb1 | pbm | pb2 |

FIG. 2C 24/25(0,7,3,3) CODE CONSTRUCTION

| | | | | | | | | | | | | |
|---|---|---|---|---|---|---|---|---|---|---|---|---|
| ℓ1 ONLY | a(2+G) | a(12) | a(13) | 1 | a(5) | a(6) | a(7) | a(8) | 1 | a(10) | a(11) | 0 | 0 | 1 |
| CODE VIOLATION | | | | pb1a | | | | | | | | pb1 | pbm | pb2 |
| NOT ℓ1 ONLY | 1 | a(2) | a(3) | 0 | a(1) | a(4) | a(12) | a(13) | 1 | a(10) | a(11) | 0 | 0 | 1 |
| CODE VIOLATION | | | | pb1a | | | | | | | | pb1 | pbm | pb2 |

FIG. 2D 32/33(0,9,4,4) CODE CONSTRUCTION

| | | | | | | | | | | | | | | | | |
|---|---|---|---|---|---|---|---|---|---|---|---|---|---|---|---|---|
| ℓ1 ONLY | a(2+G) | a(2) | a(16) | a(17) | 1 | a(6) | a(7) | a(8) | a(9) | a(10) | 1 | a(12) | a(13) | a(14) | a(15) | 0 | 0 | 1 |
| CODE VIOLATION | | | | | pb1a | | | | | | | | | | | pb1 | pbm | pb2 |
| NOT ℓ1 ONLY | 1 | a(2) | a(3) | a(4) | 0 | a(6) | a(1) | a(5) | a(16) | a(17) | 1 | a(12) | a(13) | a(14) | a(15) | 0 | 0 | 1 |
| CODE VIOLATION | | | | | pb1a | | | | | | | | | | | pb1 | pbm | pb2 |

FIG. 2E 24/25(0,9) CODE CONSTRUCTION

| | | | | | | | | | | | | | |
|---|---|---|---|---|---|---|---|---|---|---|---|---|---|
| ℓ1 ONLY | a(8) | a(9) | 1 | a(4) | a(5) | a(6) | a(7) | $UL_1$ | $UL_2$ | $UL_3$ | $UL_4$ | 0 | 0 | 1 |
| CODE VIOLATION | | | pb1a | | | | | | | | | pb1 | pbm | pb2 |
| NOT ℓ1 ONLY | 1 | a(2) | 0 | a(1) | a(8) | a(9) | 1 | $UL_1$ | $UL_2$ | $UL_3$ | $UL_4$ | 0 | 0 | 1 |
| CODE VIOLATION | | | pb1a | | | | | | | | | pb1 | pbm | pb2 |

GENERAL RATE N/(N+1) (0, G) CODE CONSTRUCTION FOR DATA CODING

CROSS-REFERENCE TO RELATED APPLICATIONS

This application is related to U.S. patent application Ser. No. 09/059,061, filed Apr. 13, 1998, the teachings of which are incorporated herein by reference. This application is also related to U.S. patent application Ser. No. 09/205,319 filed Dec. 4, 1998, the teachings of which are also incorporated herein by reference.

BACKGROUND OF THE INVENTION

1. Field of the Invention

The present invention relates in general to modulation encoding and decoding for transmission or storage media, such as magnetic recording systems, and, more particularly, to a system employing a general modulation code construction to form run-length limited block codes.

2. Description of the Related Art

Many conventional magnetic recording systems include partial response or peak-detection magnetic recording channels for data detection. Data detection within a digital communication channel is generally based on periodically sampling the amplitude of the transmitted signal. Enhancements to encoding techniques extend the performance of partial response and peak detection systems by allowing more transitions, or high transition density, without degrading data detection.

In a magnetic recording system, data are first encoded with an error correction code, and then modulation encoded with an encoder and a precoder. The modulation encoded data are written to a recording channel of a magnetic recording media, such as disk or tape. When the magnetic recording channel is read by a read-back head, an equalizer equalizes the input signal to a target partial response (PR). The equalized signal may then be applied to a maximum likelihood (ML) sequence detector, also known as a Viterbi detector, to reconstruct the sequence of the modulation encoded data. The reconstructed sequence may then be subject to inverse coding operations, such as unprecoding, modulation decoding, and then error correction decoding.

Modulation codes may be employed to achieve high transition densities within magnetic recording systems. High transition densities permit more frequent timing and gain control updates. More frequent timing and gain control updates, in turn, result in a lower signal to noise ratio (SNR) requirement of an input signal from the magnetic recording channel for a given level of performance. The modulation encoder and precoder include circuitry to provide timing recovery and gain control information as used with the equalizer. Consequently, frequent non-zero or other active information is provided to the recording channel. Active information is desirably provided without degrading the efficacy of the ML sequence detector to correctly detect the sequence for a given PR. The modulation encoder receives a group of N bits and encodes the N bits as a group of M channel symbols with a modulation code such that the group of M channel symbols satisfies given constraints.

Several properties are desirable for a modulation code for a given implementation of a modulation encoder. First, the modulation code should be a block code where no a priori knowledge of bits or other bit group information is required for decoding other than the given group of N bits and M channel symbols. Second, the code should have a high rate, or coding density, of N/M, and, third, the code should have constraints that provide good performance for a given PR. Fourth, the code should be efficiently implemented in a logic circuit, and, fifth, the code should not affect the efficacy of the ML sequence detector.

Run length limited (RLL) block codes may be used for the modulation code, and these RLL block codes may be characterized by the coding density of N/M, where N is an integer that is either a multiple or sub-multiple of eight, and M is an integer greater than N. The constraint that N be a multiple or submultiple of eight results from the outer error correction encoding and decoding operations being performed on a byte-by-byte basis. A block of bits from a recording channel that contains one or more errors has the entire decoded block contaminated. Accordingly, alignment of block boundaries with byte boundaries reduces the number of contaminated bytes.

RLL block codes are also characterized by run length constraints, labeled as (d, G/I, l, r), where d is the minimum number of zeros between ones, G is the maximum number of zeros, between ones, and I is the maximum number of consecutive zeros between ones in odd/even substrings. For high density codes, d=0, while the G constraint is a value that ensures sufficient transitions for the timing recovery and gain control circuits. Depending on the PR, the I constraint (and/or the G constraint) avoids quasi-catastrophic sequences that may reduce the effectiveness of ML sequence detectors. The constraints l and r are related to the G constraint and specify the maximum number of zeros on the left and right endpoints of the RLL block code, respectively.

The I constraint is generally only useful for some PR channels, an example of which is a channel with a partial response transfer function of the form $1-D^2$, also known as a PR4 channel. However, transfer functions of other PR channels may be preferred. For example, the EPR4 channel may be employed which is characterized by the PR transfer function of $1+D-D^2-D^3$. For the EPR4 channel, the G constraint itself, in conjunction with a $1/(1 \oplus D^2)$ precoder, provides sufficient timing and/or gain control information while limiting the quasi-catastrophic sequences (here, "$\oplus$" is the exclusive-or operation). Magnetic recording systems with PRML magnetic recording channels have employed a popular 8/9 code with constraints (d=0, G=4, I=4), such as is described in U.S. Pat. No. 4,707,681. This lower rate code has been extended to a higher rate of 16/17, disclosed in U.S. Pat. No. 5,604,497. These types of codes yield a high rate but at the expense of degrading the G and I constraints, which become, for example, (d=0, G=12, I=8). Further, rate 16/17 codes have been constructed which are not derived from a lower rate 8/9 code, and this construction is described in, for example, U.S. Pat. No. 5,635,933.

SUMMARY OF THE INVENTION

The present invention relates to encoding or decoding of a dataword having N element values, the dataword divided into left and right substrings that are encoded as a run-length limited (RLL) codeword in accordance with a general rate N/(N+1) (0, G) code construction. The general rate N/(N+1) (0, G) code construction forms a N/(N+1) (0, G) codeword with constraints (d=0, G=(N/4)+1, l=N/8, r=N/8) from the dataword. For the constraints (d=0, G=(N/4)+1, l=N/8, r=N/8) where d is the minimum number of zeros between ones, G is the maximum number of zeros, between ones, and l and r specify the maximum number of zeros on the left and right endpoints of the RLL block code, respectively.

An exemplary embodiment of an encoder encodes a sequence of N-element datawords into a sequence of (N+1)- element codewords for storage or transmission such that the sequence of codewords satisfies a G constraint, wherein the G constraint corresponds to a maximum number of elements having the same value and G being (N/4)+1. Each dataword is stored as left and right substrings, and the invention determines whether each of the left and right substrings contains at least one code violation of either a first or second case. The first case corresponds to a substring having only an end code violation in which the G constraint would be violated by two adjacent codewords having adjacent end code violations; and the second case corresponds to a substring having at least one G constraint violation within the substring. A middle pivot bit is inserted between the left and right substrings. The dataword is then encoded into the codeword by, if at least one of the left and right substrings has a code violation, defining a first pivot bit for the left substring and a first pivot bit for the right substring, each first pivot bit adjacent to the middle pivot bit and the pair of first pivot bits indicating whether code violations exist in the left substring only, the right substring only, or both left and right substrings. If a substring has a code violation, the encoder circuit defines a second pivot bit for the substring, the second pivot bit indicating whether the code violation is of the first case or the second case. Each code violation is corrected by:

(i) if the code violation is of the first case, then setting the second pivot bit to correct the end code violation and defining and setting a first correction bit to prevent a violation of the G constraint resulting from setting the middle pivot bit and the first pivot bit of the substring;

(ii) if the code violation is of the second case, then defining and setting second correction bit to correct end code violation and defining and setting a third correction bit to correct the violation of the G constraint within the substring; and (iii) moving values of one or more elements overwritten by a pivot or correction bit to element positions corresponding to elements whose values are identified by the pivot bits as being part of a code violation, thereby to generate the (N+1)-element codeword corresponding to the N-element dataword.

An exemplary embodiment of a decoder that decodes a (N+1)-element codeword formed by an encoder of the present invention detects a middle pivot bit and first and second portions of the codeword, each portion adjacent to the middle pivot bit. The dataword is generated from the first and second portions by, if the middle pivot bit is set to one value, 1) extracting a set of preserved bits and a first pivot bit for each portion; 2) generating, for each portion, a substring from the set of preserved elements and, if a second pivot bit is detected in the portion, from at least one code violation defined by the second pivot bit; and 3) combining each substring to form the dataword. Otherwise, if the middle pivot bit is set to another value, the dataword is generated by providing the first and second portions as the dataword.

A further embodiment of an encoder employs the N/(N+1) (0, G) code construction to form an (N+8)/(N+9) (0, G+4) codeword from a dataword A having N+8 elements. In accordance with the further embodiment, the N/(N+1) (0, G) code construction forms an N/(N+1) (0, G) codeword from N elements of the dataword A. The remaining eight elements are interleaved into the N/(N+1) (0, G) codeword to form the (N+8)/(N+9), (0, G+4) codeword.

A further embodiment of a decoder employs the N/(N+1) (0, G) code construction to form a dataword A having N+8 elements from an (N+8)/(N+9) (0, G+4) codeword. In accordance with the further embodiment, eight elements and an N/(N+1) (0, G) codeword are de-interleaved from an (N+8)/(N+9) (0, G+4) codeword. The N/(N+1) (0, G) codeword is decoded in accordance with the N/(N+1) (0, G) code construction to form a group of N elements of the dataword A. The eight elements and the decoded N elements are provided as the dataword A.

BRIEF DESCRIPTION OF THE DRAWINGS

Other aspects, features, and advantages of the present invention will become more fully apparent from the following detailed description, the appended claims, and the accompanying drawings in which:

FIG. 2 illustrates assignment of left substring elements of a dataword to left substring elements of a codeword for a general rate N/(N+1) (0, G) code construction and four code constructions with N=16, 24, and 32;

DETAILED DESCRIPTION

Magnetic Recording System

The present invention relates to systems that encode or decode datawords having N elements, N preferably being an integer multiple of eight. Each dataword is divided into N/8 bytes of binary data that are encoded as a run-length limited (RLL) codeword in accordance with a general rate N/(N+1) (0, G) code construction. The general rate N/(N+1) (0, G) code construction is characterized by the constraints (d=0, G=(N/4)+1, l=N/8, r=N/8). The N/(N+1) (0, G) codeword is constructed from the dataword in accordance with one or more pivot bits, one or more correction bits if necessary, and one or more preserved elements if necessary. The pivot bits, correction bits, and preserved elements identify and determine a set of corrections corresponding to predefined cases of code violations. The set of corrections limits the number of consecutive zeros received by, for example, a magnetic recording channel to (N/4)+1. The N/(N+1) (0, G) codewords generated in accordance with the general rate N/(N+1) (0, G) code construction may exhibit a high transition density. The high transition density allows for more frequent timing and gain control updates, and so results in lower required channel input signal to noise ratio for a given channel performance. While the preferred embodiments are described below with respect to datawords having N elements with N a multiple of eight, the present invention is not so limited and the techniques described herein may be employed for encoding/decoding datawords having N elements, with N any integer greater than eight.

Figure 1:
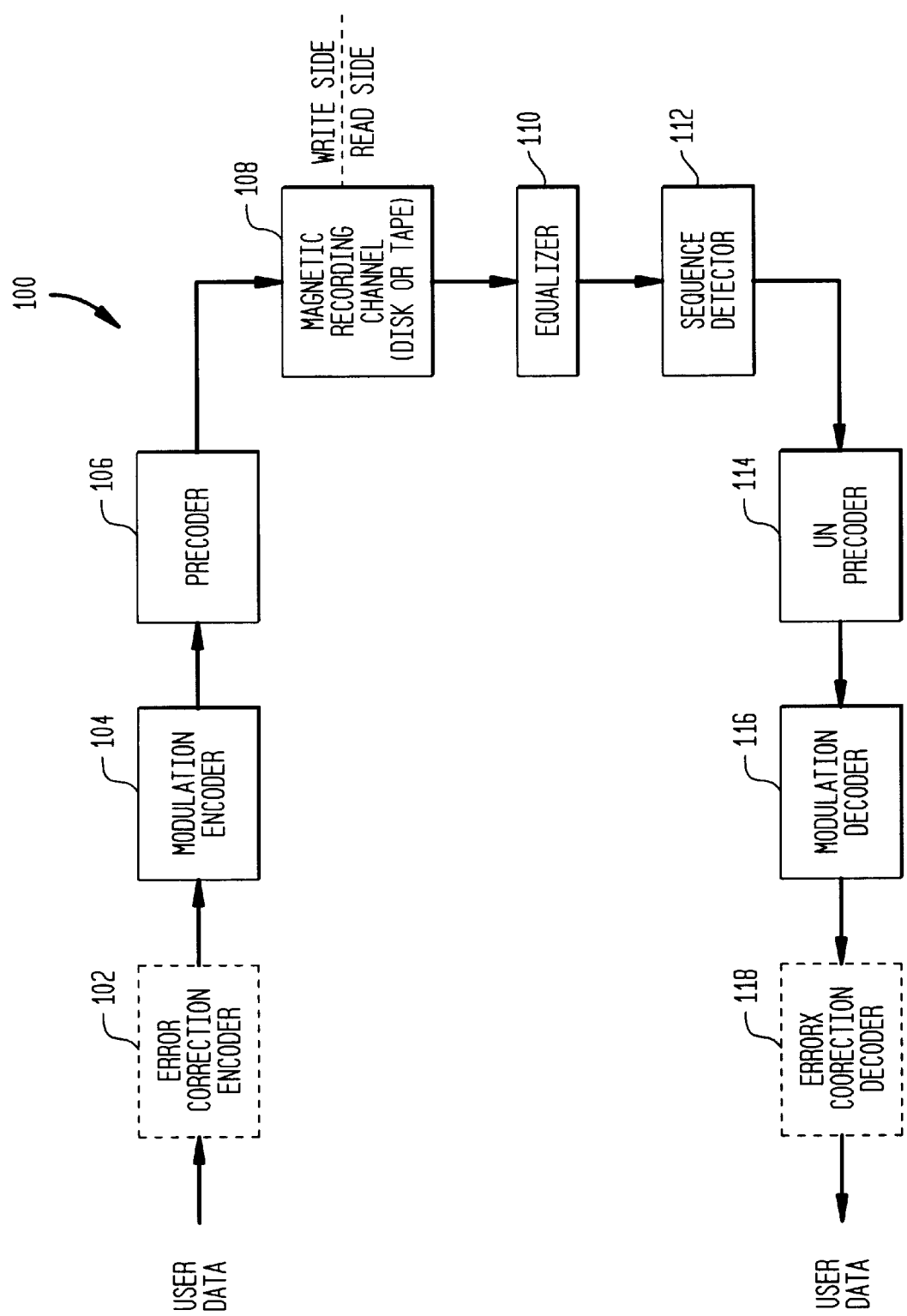
FIG. 1 is a block diagram showing a system having a modulation encoder and a modulation decoder employing a general rate N/(N+1) (0, G) code construction in accordance with an exemplary embodiment of the present invention.

FIG. 1 is a block diagram showing an exemplary embodiment of a magnetic recording system 100 employing modulation encoding and decoding with the general rate N/(N+1) (0, G) code construction of the present invention. As shown in FIG. 1, the system 100 includes an encoding section having an optional error correction encoder 102, modulation encoder 104, and precoder 106. The system 100 also includes a decoding section including an equalizer 110, sequence detector 112, unprecoder 114, modulation decoder 116, and optional error correction decoder 118. Modulation encoded information from the encoding section is written to a magnetic recording channel 108, which may be magnetic disk or tape media, and the coded information is read from the magnetic recording channel 108 by the decoding section.

The modulation encoder 104 receives data as a sequence of elements, with a block of N elements forming dataword A=a(1), a(2), . . . , a(N), N preferably being an integer multiple of eight. Optional error correction encoder 102 may receive user data and encode the user data using error correction techniques as are known in the art to provide each dataword A. The modulation encoder 104 encodes each dataword A as a codeword Z=z(1), z(2), . . . , z(N+1) having N+1 symbols and satisfying the constraints of the general rate N/(N+1) (0, G) code construction of the present invention. The sequence of codewords Z generated by the modulation encoder 104 is then subject to a precoding process by precoder 106. The precoder 106 may verify that the output codeword Z of the modulation encoder 106 satisfies requirements of peripheral gain control and timing recovery circuits, such as an all ones sequence, an all zeros sequence, and an alternating one-zero sequence (i.e., a "101010 . . . ")sequence being encoded and recorded as different, predefined bit sequences. Such precoder 106 may be, for example, a precoder of the form $1/(1 \oplus D^2)$.

The output sequence of the precoder 106 is then written to the magnetic recording channel 108 using, for example, a recording head. The decoding section reads the recorded sequence as a signal from the magnetic recording channel 108 by a device such as, for example, a read-back head. The received signal is then equalized within equalizer 110 such that the equalized signal corresponds to a partial response transfer function, (e.g., an EPR4 transfer function) which also represents an output channel response polynomial corresponding to the received sequence of levels. The received sequence is provided to the sequence detector 112. Sequence detector 112, which may be a Viterbi detector, determines a sequence of symbols in a state trellis structure that is "closest" to the received sequence of levels, with closest being in accordance with a predefined minimum error metric. The sequence detector 112 then provides the determined sequence of symbols as the output symbol sequence.

The unprecoder 114 receives the output symbol sequences and reverses the precoding operation of the precoder 106. Unprecoder 114 then provides a sequence of codewords (Z) to the modulation decoder 116. Modulation decoder 116 decodes each codeword Z in accordance with the N/(N+1) (0, G) code construction of the present invention to provide a recovered sequence of datawords A. Optional error correction decoder 118 may then be used to perform error correction processing to provide reconstructed user data.

General Rate N/(N+1) (0, G) Code Construction

Encoding/decoding of datawords into/from codewords is a mapping operation. The following describes the mapping operation for the general rate N/(N+1) (0, G) code construction in accordance with the present invention. The mapping by the general rate N/(N+1) (0, G) code construction is characterized by the constraints (d=0, G=(N/4)+1, l=N/8, r=N/8).

A dataword A is received by the encoder, where the dataword A has N element values (e.g., bits) with N being an integer multiple of eight. Dataword A comprises elements a(1), . . . , a(N) corresponding to the N element values. The dataword A is split into left and right substrings, each substring having N/2 elements. The left substring comprises elements a(1), . . . , a(N/2); and the right substring comprises the elements a((N/2)+1), . . . , a(N). A temporary codeword B is constructed having N+1 elements b(1), . . . , b(N+1). The middle element of temporary codeword B, b(N/2+1), is defined as a middle pivot bit pbm and is initially set to one. The elements b(1), . . . , b(N/2) of the left substring of temporary codeword B may correspond to the elements a(1), . . . , a(N/2), of the left substring of dataword A. The elements b((N/2)+2), . . . , b(N+1) of the right substring of temporary codeword B, may correspond to the elements a((N/2)+1), . . . , a(N) of the right substring of dataword A.

The left and right substrings of the temporary codeword B are examined to detect predefined code violations present in either or both of the substrings. The predefined code violations are related to the (d, G, l, r) constraints for the codeword Z. For the general rate N/(N+1) (0, G) code construction of the present invention, no more than N/8 zeros may be present at either end of the codeword Z. Also, no more than (N/4)+1 consecutive zeros may be present anywhere within the codeword Z (including sequences that include a correction or pivot bit). These code violations may be defined as an L code violation or a K code violation. The L code violation is defined as L=(N/8)+1 or more zeros present at an end of the temporary codeword B, and the K code violation is defined as K=(N/4)+2 or more consecutive zeros present within the temporary codeword B. Code violations are further defined based on whether the violation occurs in the left string or the right string of the temporary codeword B.

Different operations are performed to produce a codeword Z that satisfies the run length constraints (d, G, l, r) depending on whether 1) only left-only substring code violations; 2) right-only substring code violations; or 3) both left- and right-only substring code violations are present in temporary codeword B. The code construction for left-only substring code violations is as described below, and a similar code construction may be employed for only right substring code violations because of symmetry of temporary codeword B. However, as would be apparent to one skilled in the art, the element index of right substring elements of temporary codeword B may correspond to the index of the corresponding element of dataword A shifted by one due to the insertion of the pivot bit between the left and right substrings. The code construction when both left and right substring code violations occur may be formed from a union of the code construction employed for left-only and right-only substring code violations.

The code construction is completely symmetric about the middle pivot bit pbm for code violation identification and correction in the temporary codeword B. Symmetry in the code construction process implies that operations performed in one substring of temporary codeword B are the same as operations performed in the other substring (but definitions for the code violation element sequences may be mirrored about the middle pivot bit pbm). For example, and left substring end violation sequence as being the sequence from a(1) to a(L) is symmetric with the left substring end violation sequence as being the sequence from a(N) to a(N−L+1). Consequently, the following describes code violation identification and correction for the case of left-only substring code violations in the temporary codeword B.

The K and L code violations that occur in each substring are further classified into types 1, 2, . . . , p (p an integer and p=(N/2)−G) based on the position of the code violation in the substring. If the code violation occurs in the left substring they are classified as type l1, l2, . . . , lp, while code violations that occur in the right substring, from symmetry, may be classified as type r1, r2, . . . , rp. Table 1 summarizes the code violations for the general case with reference to the left string elements of the temporary codeword B, and also shows code violations for N=16, 24, and 32. In Table 1, the values l and r specify the maximum number of zeros at the left and right ends of the left and right substrings, respectively, of temporary codeword B (and, hence, codeword Z). The elements of the common zeros column correspond to the elements which are zero for all types of code violations, other than l1, due to an overlap in the sequences having G+1 or more consecutive zeros.

tions. These defined values for the first pair of pivot bits pb1 and pb2 ensure that, when no code violation is present in a substring, the first pair of pivot bits themselves do not cause a subsequent code violation in the codeword Z.

When pivot bit pb1 is zero and pivot bit pb2 is one, indicating that there is a code violation in the left substring, the pivot bit pb1$a$ indicates the type of code violation and, therefore, the position of the code violation within the left substring. Pivot bit pb1$a$ is set to one to indicate that the left substring has only a type l1 code violation. All other types of code violations in the left substring are indicated by setting the pivot bit pb1$a$ to zero.

Similarly, when pivot bit pb1 is one and pivot bit pb2 is zero, indicating that there is a code violation in only the right

TABLE 1

| N | G | l = r | K | L | zeros for type l1 violation | zeros for type l2 violation | number | zeros for lp violations | common zeros |
|---|---|---|---|---|---|---|---|---|---|
| N | N/4 + 1 | N/8 | N/4 + 2 | N/8 + 1 | b(1) . . . b(L) | b(2) . . . (b2 + G) | p = N/2 − G | b(p) . . . b(N/2) | b(p) . . . b(2 + G) |
| 16 | 5 | 2 | 6 | 3 | b(1) . . . b(3) | b(2) . . . b(7) | 3 | b(3) . . . b(8) | b(3) . . . b(7) |
| 24 | 7 | 3 | 8 | 4 | b(1) . . . b(4) | b(2) . . . b(9) | 5 | b(5) . . . b(12) | b(5) . . . b(9) |
| 32 | 9 | 4 | 10 | 5 | b(1) . . . b(5) | b(2) . . . b(11) | 7 | b(7) . . . b(16) | b(7) . . . b(11) |

In general, when a type l1 code violation is present in temporary codeword B, the values are all zero for elements b(1), . . . , b(L) (corresponding to the elements a(1), . . . , a(L) of dataword A). For code violations in the left substring, the case when only the type l1 code violation is present is defined separately from the case of all other type code violations. If there is a type l2 code violation, values for elements b(2), . . . , b(2+G) are zero (corresponding to the values of elements a(2), . . . , a(2+G) of dataword A). The elements b(i), . . . , b(i+G) being zero as shown by the type l2 code violation holds for each of the type li code violations, i an integer and 2≦i≦p. A maximum number of p=(N/2)−G code violations may be present at the left substring of the temporary codeword B. For the lpth violation, values for elements b(p), . . . , b(N/2) are zero (corresponding to the elements a(p), . . . , a(N/2) of dataword A).

If there are no code violations in temporary codeword B, the elements of the temporary codeword B are assigned to the corresponding elements of the output codeword Z. For the no code violation case, the middle pivot bit pbm is one. A decoder receiving the codeword Z and detecting the value one for the middle pivot bit pbm removes the pivot bit, and provides the left and right substrings of codeword Z as the output dataword A.

For the case of one or more code violations, the middle pivot bit pbm is set zero to indicate that at least one code violation occurred in the temporary codeword B. In addition to the middle pivot bit pbm, two additional sets of pivot bits are defined: a first pair of pivot bits pb1=p(N/2) and pb2=b((N/2)+2) on either side of the middle pivot bit pbm, and a second pair of pivot bits pb1$a$=b(L) and pb2$a$=b(N−(N/8)+1).

The first pair of pivot bits pb1 and pb2 are inserted in the left and right substrings, respectively, to indicate the presence of at least one code violation in the corresponding substring. For a preferred embodiment of the present invention, the first pair of pivot bits pb1 and pb2 are respectively set to: 1) zero and one to identify a left-only substring code violation, 2) one and zero to identify a right-only substring code violation, and 3) one and one to identify both left-only and right-only substring code violasubstring, the pivot bit pb2$a$ indicates the type of code violation and, therefore, the position of the code violation within the right substring. Pivot bit pb2$a$ is set to one to indicate that the left substring has only a type r1 code violation. All other types of code violations in the left substring are indicated by setting the pivot bit pb2$a$ to zero.

Once the temporary codeword B is constructed and pivot bit values set, the one or more combinations of the code violations that are present in each substring are then corrected by setting values of elements defined as correction bits. The remaining elements of each substring with values not included in the common zeros of the code violations are preserved, along with the elements with values set as correction bits and elements corresponding to the positions of the pivot bits pb1, pb2, pb1$a$ and pb2$a$.

Constructing the left substring of codeword Z for the first case of a type l1 only code violation is now described. For the presence of only a type l1 code violation, values for elements a(1), a(2), . . . , a(L), of dataword A are all zero. For the type l1 only code violation, setting pbl$a$ to one at position L corrects the code violation, and identifies (to a decoder) the values of elements a(1), . . . , a(L) as being zero. The element a(L) is initially assigned to element b(L) of the temporary codeword B. When a code violation occurs in the left substring, the element b(L) is then defined as pivot bit pb1$a$. The value of a(L) need not be preserved, however, since the value is zero as identified by the presence of the type l1 only code violation. Therefore, since elements a(1), . . . , a(L−1) are also known (equal zero), other elements may be assigned to element positions z(1), . . . , z(L−1) of codeword Z.

Elements a(L+1), . . . , a((N/2)−1) assigned to elements b(L+1), . . . b((N/2)−1) do not correspond to the type l1 only code violation. Elements a(L+1), . . . , a((N/2)−1) assigned to elements b(L+1), . . . , b((N/2)−1) may be assigned to the corresponding positions of the codeword Z. For the case of a type l1 only code violation, when the value of N is greater than 16, a violation of the G code constraint (i.e., the maximum number of zeros between ones) may occur since the pivot bits pb1 and pbm of the codeword B (and codeword Z) are set to zero. The constraint may be violated when the values for the element sequence z(L+1), ..., z((N/2)−1) are zero. Consequently, for N greater than 16, a correction bit is set to prevent this constraint violation. Setting any of these values b(L+1), ..., b((N/2)−1) to one and preserving the value of the element in one of the positions z(1), ..., z(L−1) corrects the constraint violation if it should occur. Although any one of these elements z(L+1), ..., z((N/2)−1) may be set to one, the preferred embodiment desirably defines the element z(2+G) as the correction bit and sets the value to one. The corresponding value of element a(2+G) assigned to b(2+G) is desirably preserved at the element position z(1) of codeword Z.

The elements a(N/2) and a((N/2)+1) of dataword A are initially assigned to element positions b(N/2), and b((N/2)+2) of the temporary codeword B. When a code violation occurs, the elements a(N/2) and a((N/2)+1) are preserved since the corresponding elements b(N/2) and b((N/2)+2) are subsequently assigned to the pivot bits values pb1 and pb2 for the output codeword Z. Therefore, elements a(N/2) and a((N/2)+1) of dataword A are assigned to any two of the elements in the remaining subset of b(1), ..., b(L−1), and, hence, z(1), ..., z(L−1) of output codeword Z. For a right only substring code violation, the pivot bits pb1 and pb2 are assigned to any two of the elements in the remaining subset of b(N), ..., b(N−L+1), and, hence, z(N), ..., z(N−L+1) of output codeword Z. When code violations occur in both the left and right substrings, the pivot bits pb1 and pb2 are may be assigned to any two of the elements in the remaining subset of z(1), ..., z(L−1), and z(N), ..., z(N−L+1) (or duplicated in both substrings) of output codeword Z.

Constructing the codeword Z for the second case is now described (the complement of the type 11 only code violation). For all other types of code violations, two elements are defined as first and second correction bits, and these correction bits are set to one to correct any code violations in the substring. In general, if a type 11 code violation occurs in addition to one of the other type li code violations, defining any one of the elements b(1), ..., b(L−1) of codeword B as a first correction bit and setting the value to one will correct the type 11 code violation. However, the presence or absence of the code violation may not be known to the decoder. Therefore, the value of the element corresponding to the position of the first correction bit (i.e., selected from the elements b(1), ..., b(L−1)) is desirably preserved.

For the second correction bit, two aspects are considered. First, the second correction bit may be selected from the sequence of elements b(p), ..., b(2+G), since the corresponding element values of a(p), ..., a(2+G), are all zero and common to all li types of code violations ($2 \leq i \leq p$). Consequently, the value of the element in temporary codeword B corresponding to the position of the second correction bit need not be preserved if selected from elements b(p), ..., b(2+G). Second, since the pivot bit pb1a is set to zero, the code construction desirably selects the second correction bit as the element having a position equivalent to the position of the element of the first correction bit with an offset of G+1. For example, if b(i) is the element for the first correction bit, the second correction bit is the element b(i+G+1). Such selection for the second correction bit may be so that the pivot bit pb1a does not itself cause a G code constraint violation in the output codeword Z.

For the preferred embodiment of the present invention, the elements b(1) and b(2+G) are defined as the first and second correction bits, respectively, and each is set to one. Therefore, the element a(1) initially assigned to element b(1) is preserved. However, since the values of the element sequences a(p), ..., a(2+G) are all zero and common to all li types of code violations ($2 \leq i \leq p$), the value for element a(2+G), need not be preserved. In addition, since element b(2+G) is set to one for all code violation types, the resulting logic implementation may be simplified.

Since the values of the element sequence a(p), ..., a(2+G) are all zero and common to all li types of code violations ($2 \leq i \leq p$), these element values are not necessarily preserved. Therefore, the corresponding positions z(p), ..., z(2+G) in the codeword Z are available to preserve other values of elements at positions that are subsequently defined for the purposes of code construction (e.g., pivot bits). As with the type 11 only violation, the elements a(N/2) and a((N/2)+1) of dataword A are initially assigned to element positions b(N/2) and b((N/2)+2) of the temporary codeword B. The elements a(N/2) and a((N/2)+1) need to be preserved if elements of positions b(N/2), and b((N/2)+2) are subsequently assigned the pivot bits values pb1 and pb2 in the output codeword Z. Consequently, the elements a(1) through a((N/4)−2), a(3+G) through a(N/2), and a((N/2)+1) of dataword A may be preserved in the element positions of the codeword Z not assigned to pivot bits or correction bits.

While the general rate N/(N+1) (0, G) code construction has been described with respect to operations of the left-only substring code violation, the code construction is completely symmetric about the middle pivot bit pbm for code violation identification and correction in the temporary codeword B. Symmetry in the code construction process implies that operations performed in the left substring of temporary codeword B are the same as operations performed in the right substring (but definitions for the code violation element sequences and positions may be mirrored about the middle pivot bit pbm).

FIG. 2(a) illustrates the left substring elements of a dataword A assigned to left substring elements of a codeword Z for a general rate N/(N+1) (0, G) code construction of the present invention. Also shown in FIGS. 2(b)–2(d) are codewords are formed from datawords having N=16, 24, and 32 (i.e., corresponding to rate 16/17 (0, 5, 2, 2), 24/25 (0, 7, 3, 3), and 32/33 (0, 9, 4, 4) code constructions, respectively). Elements of dataword A not subsequently defined for pivot bits or correction bits in dataword B are preferably positioned in codeword Z at their initially assigned positions. However, as would be apparent to one skilled in the art, the positions of the remaining initially assigned elements and the preserved elements may subsequently be rearranged within the positions of temporary codeword B not defined for pivot bits and/or correction bits. Such rearrangement may be needed to prevent certain reserved sequence patterns from occurring in the codeword Z, such as the alternating ones and zeros sequence.

Given the above method of encoding the dataword A into codeword Z, the method of decoding the codeword Z is determined by the values of the pivot bits in the output codeword. First, the middle pivot bit pbm is removed and the value examined. As described previously, if the middle pivot bit pbm is set to one, then no decoding operations are performed other than removal of the middle pivot bit pbm.

Otherwise, if the middle pivot pbm is set to zero, then the code violations for the left and right substrings of the temporary codeword B are determined from the additional sets of pivot bits (e.g., type 11 only or not type 11 only code violations) for the left-only, right-only, and both left and right code violations. The positions of the preserved bits are also determined based on the code violations identified by the additional sets of pivot bits. The dataword A may then be formed from logic equations operating on predefined combinations of the preserved elements, the elements corresponding to correction bits set to one to correct code violations, and the pivot bit values.

Alternative General Code Construction

The preferred embodiment of the general rate $N/(N+1)$ code construction as described previously employs the first pair of pivots bits pb1 and pb2 with both values set to one to identify a code violation in both the left and right substrings. An alternative embodiment of the present invention may employ the first pair of pivot bits pb1 and pb2 with both values set to zero to identify a code violation in both the left and right substrings (rather than both set to one as in the preferred embodiment). Since the first pair of pivot bits is set to zero, the alternative embodiment may not necessarily provide as high a transition density as the preferred embodiment. As described before, a temporary codeword B is formed by splitting the dataword A into left and right substrings. A middle pivot bit pbm is inserted between the left and right substrings and initially set to one.

The L and K code violations, and type 1l and type li code violations, $2 \leq i \leq p$, are defined as previously described with respect to the preferred embodiment and Table 1. In addition, the first and second pairs of pivot bits are similarly defined, except that pb1 and pb2 are set to zero to identify the presence of code violations in both left and right substrings. The following describes the code construction method for the left substring of a temporary codeword B. Code construction for the right substring is similar to the code construction of the left substring by symmetry. If a code violation occurs in both left and right substrings, the resulting codeword is formed by the union of the methods for the left and right substrings.

For the first case of the left substring containing a type 1l only code violation, the pivot bit pb1$a$ is set to a one. In addition, if N>16, then the element $b((3N/8)+1)$ is defined as a correction bit and set to one. The value for the element $a((3N/8)+1)$ is preserved, if necessary, at any one of the positions $z(1), \ldots, z(L-1)$ since these positions correspond to zero values of the code violation. The values of elements $a(N/2)$ and $a(N/2+1)$ are also preserved since the positions $b(N/2)$ and $b((N/2)+2)$ are defined for pivot bits.

For the second case of all other types of code violations (i.e., not a type 1l only code violation), two elements are defined as first and second correction bits, and these correction bits are set to one to correct any code violations in the substring. In general, if a type 1l code violation occurs with another of the type li code violations, defining any one of the elements $b(1), \ldots, b(L-1)$ of temporary codeword B as a first correction bit and setting the value to one will correct the type 1l code violation. However, the presence or absence of the code violation (type 1l and type li) may not be known to the decoder. Therefore, the value of the element corresponding to the position of the first correction bit (i.e., selected from the elements $b(1), \ldots, b(L-1)$) is preserved. For the alternative embodiment, the element position $b((N/8)-1)$ is defined for the correction bit and set to one. The value of the corresponding element $a((N/8)-1)$ of the dataword A is then preserved at any one of the remaining positions $b(p), \ldots, b(2+G)$ since these positions correspond to zero values of the code violation.

For the second correction bit, since the pivot bit pb1$a$ of the second pair of pivot bits is set to zero, the code construction of the alternative embodiment desirably selects the second correction bit as the element having a position equivalent to the position of the first correction bit element offset by G+1. For example, if b(i) is the element for the first correction bit, the second correction bit is the element b(i+G+1). Such selection for the second correction bit ensures that the pivot bit pb1$a$ does not itself cause a code constraint violation in the output codeword Z. Consequently, the element position selected for the second correction bit is $b((3N/8)+1)$ and is set to one. The value of the corresponding element $a((3N/8)+1)$ is then preserved at any one of the remaining positions $b(p), \ldots, b(2+G)$ since these positions correspond to zero values of the code violation.

As in the preferred embodiment, the values for elements of dataword B that are subsequently assigned to pivot bits pb1, pb2, pb1$a$, and pb2$a$ are also preserved at any one of the remaining positions $b(p), \ldots, b(2+G)$ since these positions correspond to zero values of the code violation.

Code Construction of a Rate (N+8)/(N+9) (0, G+4) Code

The modulation encoder 104 and modulation decoder 116 of FIG. 1 may also encode and decode, respectively, in accordance with the characteristics of a general (N+8)/(N+9) (0, G+4) code construction (herein referred to as a general (N+8)/(N+9) (0, G+4) code construction. The general (N+8)/(N+9) (0, G+4) code construction is based on encoding a dataword A' having N+8 elements (i.e., a dataword A and an additional eight elements). A codeword Z' is generated by first forming an N/(N+1) (0, G) codeword Z from N/8 bytes of the dataword A in accordance with the general rate N/(N+1) (0, G) code construction, and then interleaving the remaining eight elements (or byte) into the N/(N+1) (0, G) codeword Z.

The codeword Z' of the general (N+8)/(N+9) (0, G'4) code construction is obtained by interleaving the remaining byte of dataword A in the following manner. First, the remaining byte is split into two, 4-bit portions UL and UR that are the left and right nibbles of the uncoded byte. The portions UL and UR are then inserted between different element positions of the N/(N+1) (0, G) codeword Z. The terms "LS" and "RS" are defined as the left and right substrings, respectively, on either side of the sequence of pivot bits pb1, pbm, and pb2 of the N/(N+1) (0, G) codeword Z. The N/(N+1) (0, G) codeword Z, therefore, may be represented as <LS pb1 pbm pb2 RS>. With these definitions, the (N+8)/(N+9) (0, G+4) codeword Z' is defined as <LS UL pb1 pbm pb2 UR RS>. FIG. 2(e) shows the resulting left string for a 24/25 (0,9) code construction formed from a 16/17 (0, 5, 2, 2) code.

Given the encoding method of the general (N+8)/(N+9) (0, G+4) code construction, the decoding method of the (N+8)/(N+9) (0, G+4) code construction is relatively straightforward. The elements of the interleaved, uncoded byte are simply removed, and then the remaining elements corresponding to N/(N+1) (0, G) codeword Z is decoded as described previously.

Encoder and Decoder Equations for 24/25 (0,7) Code Construction

An embodiment of the present invention may be illustrated using combinational logic equations for encoding and decoding a dataword A. The combinational logic equations may represent the operations of a logic circuit implementation for a N/(N+1) block encoder. The exemplary code construction operates on a dataword A having 24 elements (N=24), yielding a 24/25 (0,7,3,3) code construction.

The combinations of pivot bits pb1, pb2, pb1$a$, and pb2$a$, the correction bits, and preserved elements that identify code violations may be expressed using Boolean equations that express the elements (bits) of the encoder output codeword Z as a function of the element values of the input dataword A. For the following a "&" expression indicates a logical AND operation, "+" indicates a logical OR operation, and "~" indicates a logical complement.

First, a set of pre-encoding equations is defined by equation (1) through equation (18):

$$l1 = (a(1) + a(2) + a(3) + a(4)) \quad (1)$$

$$l2 = (a(2) + a(3) + a(4) + a(5) + a(6) + a(7) + a(8) + a(9)) \quad (2)$$

$$l3 = (a(3) + a(4) + a(5) + a(6) + a(7) + a(8) + a(9) + a(10)) \quad (3)$$

$$l4 = (a(4) + a(5) + a(6) + a(7) + a(8) + a(9) + a(10) + a(11)) \quad (4)$$

$$l5 = (a(5) + a(6) + a(7) + a(8) + a(9) + a(10) + a(11) + a(12)) \quad (5)$$

$$r1 = (a(21)a(22) + a(23) + a(24)) \quad (6)$$

$$r2 = (a(16) + a(17) + a(18) + a(19) + a(20) + a(21) + a(22) + a(23)) \quad (7)$$

$$r3 = (a(15) + a(16) + a(17) + a(18) + a(19) + a(20) + a(21) + a(22)) \quad (8)$$

$$r4 = (a(14) + a(15) + a(16) + a(17) + a(18) + a(19) + a(20) + a(21)) \quad (9)$$

$$r5 = (a(13) + a(14) + a(15) + a(16) + a(17) + a(18) + a(19) + a(20)) \quad (10)$$

$$L = (l1 \ \& \ l2 \ \& \ l3 \ \& \ l4 \ \& \ l5) \quad (11)$$

$$LC = \sim(l1 \ \& \ l2 \ \& \ l3 \ \& \ l4 \ \& \ l5) \quad (12)$$

$$l1o = ((\sim l1) \ \& \ l2 \ \& \ l3 \ \& \ l4 \ \& \ l5) \quad (13)$$

$$l1oc = \sim l1o \quad (14)$$

$$R = (r1 \ \& \ r2 \ \& \ r3 \ \& \ r4 \ \& \ r5) \quad (15)$$

$$RC = \sim(r1 \ \& \ r2 \ \& \ r3 \ \& \ r4 \ \& \ r5) \quad (16)$$

$$r1o = ((\sim r1) \ \& \ r2 \ \& \ r3 \ \& \ r4 \ \& \ r5) \quad (17)$$

$$r1oc = \sim r1o \quad (18)$$

Given the set of pre-encoding equations, the values for the output codeword elements $z(1), z(2) \ldots z(25)$ may be generated as set forth in equation (19) through equation (43):

$$z(1) = (a(1) \ \& \ L) + (LC \ \& \ ((a(9) \ \& \ l1o) + (1 \ \& \ l1oc))) \quad (19)$$

$$z(2) = (a(2) \ \& \ L) + (LC \ \& \ ((a(12) \ \& \ l1o) + (a(2) \ \& \ l1oc))) \quad (20)$$

$$z(3) = (a(3) \ \& \ L) + (LC \ \& \ ((a(13) \ \& \ l1o) + (a(3) \ \& \ l1oc))) \quad (21)$$

$$z(4) = (a(4) \ \& \ L) + (LC \ \& \ ((1 \ \& \ l1o) + (0 \ \& \ l1oc))) \quad (22)$$

$$z(5) = (a(5) \ \& \ L) + (LC \ \& \ ((a(5) \ \& \ l1o) + (a(1) \ \& \ l1oc))) \quad (23)$$

$$z(6) = (a(6) \ \& \ L) + (LC \ \& \ ((a(6) \ \& \ l1o) + (a(4) \ \& \ l1oc))) \quad (24)$$

$$z(7) = (a(7) \ \& \ L) + (LC \ \& \ ((a(7) \ \& \ l1o) + (a(12) \ \& \ l1oc))) \quad (25)$$

$$z(8) = (a(8) \ \& \ L) + (LC \ \& \ ((a(8) \ \& \ l1o) + (a(13) \ \& \ l1oc))) \quad (26)$$

$$z(9) = (a(9) \ \& \ L) + (LC \ \& \ ((1 \ \& \ l1o) + (1 \ \& \ l1oc))) \quad (27)$$

$$z(10) = a(10) \quad (28)$$

$$z(11) = a(11) \quad (29)$$

$$z(12) = (R \ \& \ ((a(12) \ \& \ L) + (0 \ \& \ LC))) + (1 \ \& \ RC) \quad (30)$$

$$z(13) = (1 \ \& \ L \ \& \ R) + (0 \ \& \ (\sim(L \ \& \ R))) \quad (31)$$

$$z(14) = (L \ \& \ (a(13) \ \& \ R) + (0 \ \& \ RC)) + (LC \ \& \ 1) \quad (32)$$

$$z(15) = a(14) \quad (33)$$

$$z(16) = a(15) \quad (34)$$

$$z(17) = (a(16) \ \& \ R) + (RC \ \& \ ((1 \ \& \ r1o) + (1 \& \ r1oc))) \quad (35)$$

$$z(18) = (a(17) \ \& \ R) + (RC \ \& \ ((a(17) \ \& \ r1o) + (a(12) \ \& \ r1oc))) \quad (36)$$

$$z(19) = (a(18) \ \& \ R) + (RC \ \& \ ((a(18) \ \& \ r1o) + (a(13) \ \& \ r1oc))) \quad (37)$$

$$z(20) = (a(19) \ \& \ R) + (RC \ \& \ ((a(19) \ \& \ r1o) + (a(21) \ \& \ r1oc))) \quad (38)$$

$$z(21) = (a(20) \ \& \ R) + (RC \ \& \ ((a(20) \ \& \ r1o) + (a(24) \ \& \ r1oc))) \quad (39)$$

$$z(22) = (a(21) \ \& \ R) + (RC \ \& \ ((1 \ \& \ r1o) + (0 \ \& \ r1oc))) \quad (40)$$

$$z(23) = (a(22) \ \& \ R) + (RC \ \& \ ((a(12) \ \& \ r1o) + (a(22) \ \& \ r1oc))) \quad (41)$$

$$z(24) = (a(23) \ \& \ R) + (RC \ \& \ ((a(13) \ \& \ r1o) + (a(23) \ \& \ r1oc))) \quad (42)$$

$$z(25) = (a(24) \ \& \ R) + (RC \ \& \ ((a(16) \ \& \ r1o) + (1 \ \& \ r1oc))) \quad (43)$$

The logical operations of the set of encoder equations may be minimized further by factoring common terms of equation (19) through equation (43). Consequently, terms may be pre-calculated and pre-encoded to reduce a number of operations on input bit values of dataword A.

The modulation decoder examines various defined pivot bits of the input codeword $Z = a(1), z(2), \ldots z(N+1)$ before providing a decoded dataword A having N elements using the elements $z(1), z(2), \ldots z(25)$. As discussed previously with respect to the code construction, the input codeword Z is formed from combinations of pivot bits, correction bits, and preserved elements of dataword A based on the detected absence or presence of one or more predefined code violations. Combinational logic equations may represent the operations of a logic circuit implementation of a N/(N+1) block decoder. Consequently, the modulation decoder 116 in accordance with the exemplary embodiment interprets the values of the pivot bits and preserved values to reconstruct the elements of dataword A To decode the (N+1)-bit codeword Z, Boolean equations may be formed to express the relationship between the input element values of codeword Z with the output element values of the decoded dataword A. A set of pre-encoding equations is defined by equation (44) through equation (52):

$$pb1a = z(4) \quad (44)$$

$$pb1 = z(12) \quad (45)$$

$$pb = z(13) \quad (46)$$

$$pb2 = z(14) \quad (47)$$

$$pb2a = z(22) \quad (48)$$

$$t1 = (\sim pb1 \ \& \ pb2) + (pb1 \ \& \ pb2) \quad (49)$$

$$t1a = (pb1 \ \& \ \sim pb2) \quad (50)$$

$$t2 = (pb1 \ \& \ \sim pb2) + (pb1 \ \& \ pb2) \quad (51)$$

$$t2a = (\sim pb1 \ \& \ pb2) \quad (52)$$

The decoded output bits $d(1), d(2), \ldots, d(24)$ corresponding to $a(1), a(2) \ldots, a(24)$ are then given by equations (53) through (76):

$$d(1) = (z(1) \& pb) + ((\sim pb) \& (((0 \& pb1a) + (z(5) \& (\sim pb1a)) \ \& \ (t1)) + (z(1) \ \& \ t1a))) \quad (53)$$

$$d(2) = (z(2) \& pb) + ((\sim pb) \& (((0 \& pb1a) + (z(2) \& (\sim pb1a)) \ \& \ (t1)) + (z(2) \ \& \ t1a))) \quad (54)$$

$$d(3) = (z(3) \& pb) + ((\sim pb) \& (((0 \& pb1a) + (z(3) \& (\sim pb1a)) \ \& \ (t1)) + (z(3) \ \& \ t1a))) \quad (55)$$

$$d(4)=(z(4)\&pb)+((\sim pb)\&(((0\&pb1a)+(z(6)\&(\sim pb1a))\&(t1))+(z(4)\&t1a))) \qquad (56)$$

$$d(5)=(z(5)\&pb)+((\sim pb)\&(((z(5)\&pb1a)+(0\&(\sim pb1a))\&(t1))+(z(5)\&t1a))) \qquad (57)$$

$$d(6)=(z(6)\&pb)+((\sim pb)\&(((z(6)\&pb1a)+(0\&(\sim pb1a))\&(t1))+(z(6)\&t1a))) \qquad (58)$$

$$d(7)=(z(7)\&pb)+((\sim pb)\&(((z(7)\&pb1a)+(0\&(\sim pb1a))\&(t1))+(z(7)\&t1a))) \qquad (59)$$

$$d(8)=(z(8)\&pb)+((\sim pb)\&(((z(8)\&pb1a)+(0\&(\sim pb1a))\&(t1))+(z(8)\&t1a))) \qquad (60)$$

$$d(9)=(z(9)\&pb)+((\sim pb)\&(((z(1)\&pb1a)+(0\&(\sim pb1a))\&(t1))+(z(9)\&t1a))) \qquad (61)$$

$$d(10)=(z(10)\&pb)+((\sim pb)\&(((z(10)\&pb1a)+(z(10)\&(\sim pb1a))\&(t1))+(z(10)\&t1a))) \qquad (62)$$

$$d(11)=(z(11)\&pb)+((\sim pb)\&(((z(11)\&pb1a)+(z(11)\&(\sim pb1a))\&(t1))+(z(11)\&t1a))) \qquad (63)$$

$$d(12)=(z(12)\&pb)+((\sim pb)\&(((z(2)\&pb1a)+(z(7)\&(\sim pb1a))\&(t1))+(((pb2a\&z(23))+(\sim pb2a\&z(18)))\&t1a))) \qquad (64)$$

$$d(13)=(z(14)\&pb)+((\sim pb)\&(((z(24)\&pb2a)+(z(19)\&(\sim pb2a))\&(t2))+(((pb1a\&z(3))+(\sim pb1a\&z(8)))\&t2a))) \qquad (65)$$

$$d(14)=(z(15)\&pb)+((\sim pb)\&(((z(15)\&pb2a)+(z(15)\&(\sim pb2a))\&(t2))+(z(15)\&t2a))) \qquad (66)$$

$$d(15)=(z(16)\&pb)+((\sim pb)\&(((z(16)\&pb2a)+(z(16)\&(\sim pb2a))\&(t2))+(z(16)\&t2a))) \qquad (67)$$

$$d(16)=(z(17)\&pb)+((\sim pb)\&(((z(25)\&pb2a)+(0\&(\sim pb2a))\&(t2))+(z(17)\&t2a))) \qquad (68)$$

$$d(17)=(z(18)\&pb)+((\sim pb)\&(((z(18)\&pb2a)+(0\&(\sim pb2a))\&(t2))+(z(18)\&t2a))) \qquad (69)$$

$$d(18)=(z(19)\&pb)+((\sim pb)\&(((z(19)\&pb2a)+(0\&(\sim pb2a))\&(t2))+(z(19)\&t2a))) \qquad (70)$$

$$d(19)=(z(20)\&pb)+((\sim pb)\&(((z(20)\&pb2a)+(0\&(\sim pb2a))\&(t2))+(z(20)\&t2a))) \qquad (71)$$

$$d(20)=(z(21)\&pb)+((\sim pb)\&(((z(21)\&pb2a)+(0\&(\sim pb2a))\&(t2))+(z(21)\&t2a))) \qquad (72)$$

$$d(21)=(z(22)\&pb)+((\sim pb)\&(((0\&pb2a)+(z(20)\&(\sim pb2a))\&(t2))+(z(22)\&t2a))) \qquad (73)$$

$$d(22)=(z(23)\&pb)+((\sim pb)\&(((0\&pb2a)+(z(23)\&(\sim pb2a))\&(t2))+(z(23)\&t2a))) \qquad (74)$$

$$d(23)=(z(24)\&pb)+((\sim pb)\&(((0\&pb2a)+(z(24)\&(\sim pb2a))\&(t2))+(z(24)\&t2a))) \qquad (75)$$

$$d(24)=(z(25)\&pb)+((\sim pb)\&(((0\&pb2a)+(z(21)\&(\sim pb2a))\&(t2))+(z(25)\&t2a))) \qquad (76)$$

The logical operations of the set of decoder equations may be minimized further by factoring common terms of equation (53) through equation (76); consequently, terms may be pre-calculated and pre-decoded to reduce the number of operations on input bits of the codeword Z.

Block Encoding System

Figure 3:
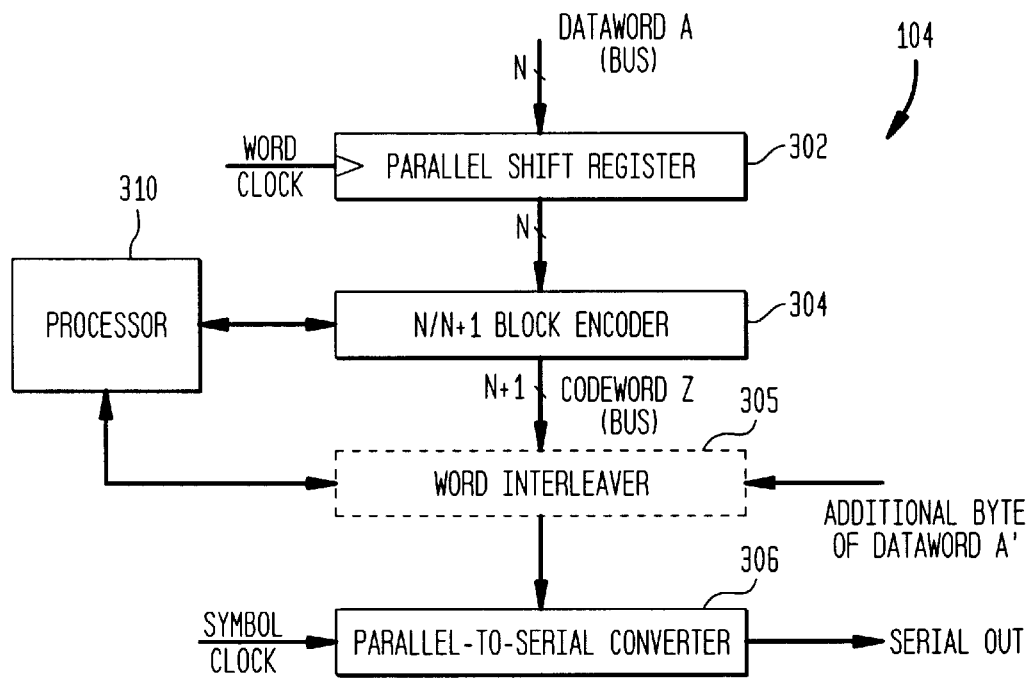
FIG. 3 is a block diagram showing an exemplary embodiment of a modulation encoder employing a general rate N/(N+1) (0, G) code construction in accordance with the present invention.

FIG. 3 is a block diagram showing a modulation encoder 104 in accordance with an exemplary embodiment of the present invention. The modulation encoder 104 of FIG. 1 includes parallel shift register 302, N/(N+1) block encoder 304, optional word interleaver 305, and parallel-to-serial converter 306. The N/(N+1) block encoder 304 of FIG. 3 constructs an output codeword Z in accordance with the general rate N/(N+1) (0, G) code construction. The N/(N+1) block encoder 304 of FIG. 3 may be a logic circuit implementing logic equations such as those given above for the rate 24/25 (0, 7, 3, 3) code encoder. Also shown in FIG. 3 is processor 310, which may be a portion of a controller of the modulation encoder 104, employed to detect and set pivot bit values. Optional word interleaver 305 may be employed if the modulation encoder 104 is employed to construct codewords Z' in accordance with the general (N+8)/(N+9) (0, G+4) code construction.

The first sequence of N bits in parallel is received by shift register 302. Shift register 302 sequentially provides N-bit parallel words to the N/(N+1) block encoder 304 in accordance with a word clock signal. The N/(N+1) block encoder 304 constructs the output codeword Z based on the input dataword A. If the optional word interleaver 305 is employed, the word interleaver 305 receives codeword Z and the additional byte of dataword A'. The word interleaver 305 then generates the codeword Z' in accordance with the general (N+8)/(N+9) (0, G+4) code construction. The parallel-to-serial converter 306 may then be employed to convert the parallel codeword Z (or parallel bit codeword Z') into a serial bit stream based on a symbol clock. A next dataword is received by the shift register 302 and then encoded to a corresponding next codeword while the present codeword is converted and transmitted from the parallel-to-serial converter 306.

Block Decoding System

The unprecoder 114 of the exemplary system 100 of FIG. 1 reverses the precoding operation of the precoder 106, and provides output codewords to the modulation decoder 116. The modulation decoder 116 decodes the symbol sequence in accordance with the general rate N/(N+1) (0, G) code construction of the present invention to provide a sequence of datawords.

Figure 4:
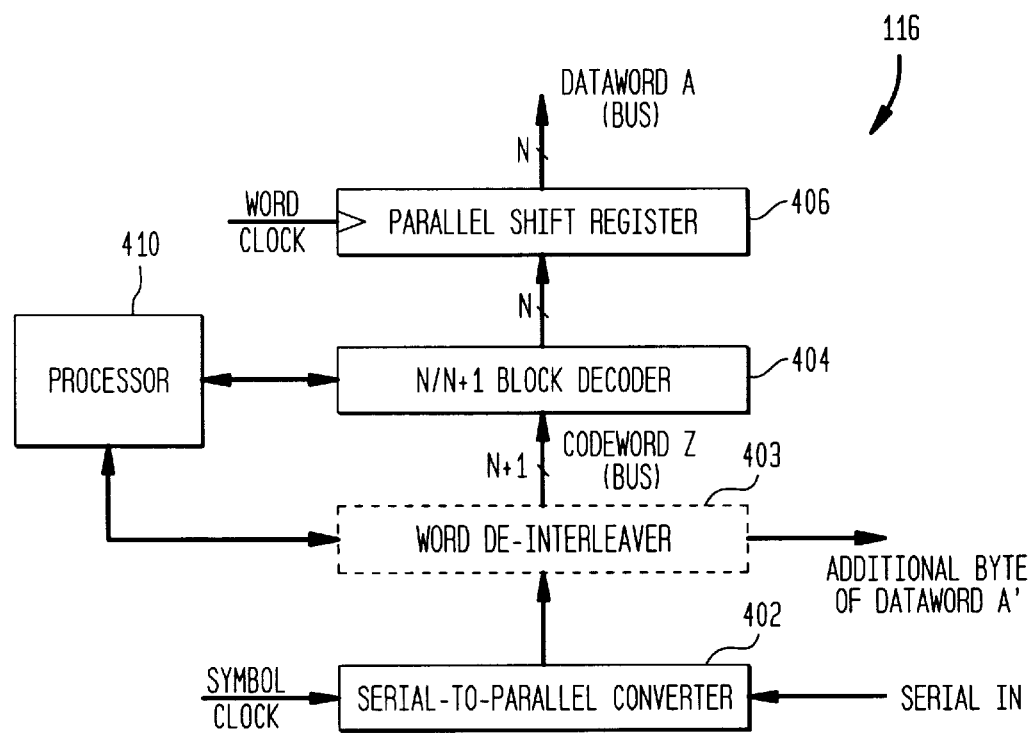
FIG. 4 is a block diagram showing an exemplary embodiment of a modulation decoder employing a general N/(N+1) (0, G) code construction in accordance with the present invention.

FIG. 4 is a block diagram showing the modulation decoder 116 of FIG. 1 in accordance with an exemplary embodiment of the present invention. The modulation decoder 116 includes a serial-to-parallel converter 402, optional word de-interleaver 403, N/(N+1) block decoder 404 and parallel shift register 406. Also shown in FIG. 4 is processor 410, which may be a portion of a controller of the modulation decoder 116, employed to detect and interpret pivot bit values. Optional word de-interleaver 403 may be employed if the modulation decoder 116 is employed to decode codewords Z' generated in accordance with the general rate N/(N+1) (0, G+4) code construction.

Each codeword Z (or codeword Z') is received as a serial symbol stream and converted to a parallel bit stream by serial-to-parallel converter 402 in accordance with a symbol clock signal. If the optional word de-interleaver 403 is employed, the word de-interleaver 403 separates the additional byte from the codeword Z' of N+9 elements to provide the codeword Z of N+1 elements to the N/(N+1) block decoder 404 and the additional byte. The N/(N+1) block decoder 404 constructs an output dataword A based on the input codeword Z, and may be a logic circuit implementing the by logic equations such as those given above for the rate 24/25 (0, 7, 3, 3) code decoder. The N/(N+1) block decoder 404 then provides these datawords A to the parallel shift register 406. Parallel datawords of N/8 bytes are then sequentially provided by the parallel shift register 406 in accordance with a word clock signal. The present codeword is converted to a corresponding dataword while the next codeword is received in the serial-to-parallel converter 402.

Although the preferred embodiments of the present invention have been described with respect to magnetic recording systems, the present invention is not so limited. The present code construction may be applied to other types of wired and wireless transmission systems to provide high transition density of signals representing data or symbol sequences. Such systems may employ the present invention for transceivers incorporating sequence detectors or bit sampling for symbol or data detection.

While the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general purpose computer.

The present invention may be embodied in the form of methods and apparatuses for practicing those methods. The present invention may also be embodied in the form of program code embodied in tangible media, such as floppy diskettes, CD-ROMS, hard drives, or any other machine-readable storage medium, wherein, when the program code is loaded into and executed by a machine, such as a computer, the machine becomes an apparatus for practicing the invention. The present invention may also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. Apparatus for encoding a sequence of N-element datawords into a sequence of codewords having at least (N+1)-elements for storage or transmission such that the sequence of codewords satisfies a G constraint, wherein the G constraint corresponds to a maximum number of consecutive elements having the same value, the apparatus comprising:

a storage circuit, coupled to an input stream to receive each dataword, adapted to store each dataword as left and right substrings;

a processor, coupled to the storage circuit, which determines whether each of the left and right substrings contains at least one code violation of either a first or second case, wherein:

the first case corresponds to a substring having only an end code violation in which the G constraint would be violated by two adjacent codewords having adjacent end code violations; and the second case corresponds to a substring having at least one G constraint violation within the substring;

an encoder circuit, coupled to the storage register, adapted to insert a middle pivot bit between the left and right substrings and adapted to encode the dataword into the codeword, wherein:

if at least one of the left and right substrings has a code violation, the encoder circuit encodes by defining a first pivot bit for the left substring and a first pivot bit for the right substring, each first pivot bit adjacent to the middle pivot bit and the pair of first pivot bits indicating whether code violations exist in the left substring only, the right substring only, or both left and right substrings;

if a substring has a code violation, the encoder circuit defines a second pivot bit for the substring, the second pivot bit indicating whether the code violation is of the first case or the second case; and the encoder circuit corrects each code violation by:

(i) if the code violation is of the first case, then setting the second pivot bit to correct the end code violation and defining and setting a first correction bit to prevent a violation of the G constraint resulting from setting the middle pivot bit and the first pivot bit of the substring;

(ii) if the code violation is of the second case, then defining and setting a second correction bit to correct an end code violation and defining and setting a third correction bit to correct the violation of the G constraint within the substring; and (iii) moving values of one or more elements overwritten by a pivot or correction bit to element positions corresponding to elements whose values are identified by the pivot bits as being part of a code violation, thereby generating the codeword corresponding to the N-element dataword.

2. The invention as recited in claim 1, wherein the codeword has elements $z(1)$ through $z(N+1)$; the first pivot bit of the left substring, the middle pivot bit, and the first pivot bit of the right substring are defined as elements $z(N/2)$, $z((N/2)+1)$, and $z((N/2)+2)$, respectively; and the second pivot bit of the left substring is defined as $z((N/8)+1)$ and the second pivot bit of the right string is defined as $z(N-(N/8)+1)$.

3. The invention as recited in claim 2, wherein:

if the code violation is of the first case, then the first correction bit of the left substring is defined as $z(2+G)$ and the first correction bit of the right substring is defined as $z(N-G)$; and if the code violation is of the second case, then the second and third correction bits of the left substring are defined as $z(1)$ and $z(2+G)$, respectively, and the second and third correction bits of the right substring are defined as $z(N+1)$ and $z(N-G)$, respectively.

4. The invention as recited in claim 1, wherein the code violation of the first case is a string of $((N/8)+1)$ consecutive values, and the code violation of the second case is a string of $((N/4)+2)$ consecutive values.

5. The invention as recited in claim 4, wherein, the codeword has the run-length constraints (d, G, l, r), d, l, and r being 0, N/8, and N/8, respectively, and wherein d is a minimum number of consecutive ones, G is a maximum number of consecutive zeros, and l and r are maximum numbers of zeros at a left end and a right end of the codeword, respectively.

6. The invention as recited in claim 1, wherein the encoder is further adapted to (1) set the middle pivot bit to a first value if at least one of the left and right substrings contains a code violation;

(2) otherwise, set the middle pivot bit to a second value and providing the left and right substrings having the middle pivot bit inserted therebetween as the codeword.

7. The invention as recited in claim 1, wherein the value for G is (N/4)+1.

8. The invention as recited in claim 7, wherein the encoder circuit further comprises:
- a register adapted to receive and divide an additional string of eight elements into left and right nibbles; and
- an interleaver circuit adapted to insert one of the left and right nibbles adjacent to the first pivot bit of the left substring and the other one of the left and right nibbles adjacent to the first pivot bit of the right substring, thereby forming a new codeword having a new G constraint being (N/4)+5.

9. The invention as recited in claim 1, wherein the sequence of codewords is represented by a signal, the signal being provided to a physical medium.

10. The invention of claim 9, wherein the physical medium is a storage medium, apparatus further comprising a recording head for storing the sequence of codewords in the storage medium.

11. The invention of claim 10, wherein the storage medium is either a magnetic recording medium or an optical recording medium storing data generated by a computer.

12. The invention of claim 9, further comprising a modulator, the modulator transmitting the signal corresponding to the sequence of codewords through either a communications medium.

13. The invention of claim 9, wherein the signal representing the sequence of codewords has a greater transition density than a signal representing the sequence of datawords.

14. The invention of claim 9, wherein the apparatus provides the signal for increased signal-to-noise ratio to a detector.

15. Apparatus for decoding a sequence of codewords having at least N+1 elements into a sequence of N-element datawords, the sequence of codewords received as a signal from a storage or transmission medium, the decoder comprising:
- a processing adapted to detect a middle pivot bit and first and second portions of each codeword, each portion adjacent to the middle pivot bit;
- a logic circuit, coupled to the processor, adapted to generate the dataword from the first and second portions by:
  if the middle pivot bit is set to a first value:
  1) extracting a set of one or more preserved bits and a first pivot bit for each portion;
  2) generating, for each portion, a substring from the set of preserved elements and, if a second pivot bit and at least one correction bit is detected in the portion, from at least one code violation defined by the second pivot bit;
  3) combining each substring to form the dataword;
  otherwise, if the middle pivot bit is set to second value, by:
  4) providing the first and second portions as the dataword.

16. The invention as recited in claim 15, wherein each codeword has been formed from the corresponding N-element dataword by:
(i) dividing each dataword into left and right substrings by inserting a middle pivot bit therebetween;
(ii) determining whether each of the left and right substrings contains at least one code violation of a first or second case, wherein:
   the first case corresponds to a substring having only an end code violation in which the G constraint would be violated by two adjacent codewords having adjacent end code violations; and
   the second case corresponds to a substring having at least one G constraint violation within the substring;
(iii) if at least one of the left and right substrings has a code violation, then defining a first pivot bit for the left substring and a first pivot bit for the right substring, each first pivot bit adjacent to the middle pivot bit and the pair of first pivot bits indicating whether code violations exist in the left substring only, the right substring only, or both left and right substrings
(iv) if a substring has a code violation, then defining a second pivot bit for the substring, the second pivot bit indicating whether the code violation is of the first case or the second case;
(v) if the code violation is of the first case, then setting the second pivot bit to correct the end code violation and defining and setting a first correction bit to prevent a violation of the G constraint resulting from setting the middle pivot bit and the first pivot bit of the substring;
(vi) if the code violation is of the second case, then defining and setting second correction bit to correct an end code violation and defining and setting a third correction bit to correct the violation of the G constraint within the substring; and
(vii) moving values of one or more elements overwritten by a pivot or correction bit to element positions corresponding to elements whose values are identified by the pivot bits as being part of a code violation, thereby generating the (N+1)-element codeword corresponding to the N-element dataword.

17. A method of encoding a sequence of N-element datawords into a sequence of codewords having at least N+1 elements for storage or transmission such that the sequence of codewords satisfies a G constraint, wherein the G constraint corresponds to a maximum number of consecutive elements having the same value, the method comprising the steps of:
(a) dividing each dataword into left and right substrings by inserting a middle pivot bit therebetween;
(b) determining whether each of the left and right substrings contains at least one code violation of a first or second case, wherein:
   the first case corresponds to a substring having only an end code violation in which the G constraint would be violated by two adjacent codewords having adjacent end code violations; and
   the second case corresponds to a substring having at least one G constraint violation within the substring;
(c) if at least one of the left and right substrings has a code violation, then defining a first pivot bit for the left substring and a first pivot bit for the right substring, each first pivot bit adjacent to the middle pivot bit and the pair of first pivot bits indicating whether code violations exist in the left substring only, the right substring only, or both left and right substrings
(d) if a substring has a code violation, then defining a second pivot bit for the substring, the second pivot bit indicating whether the code violation is of the first case or the second case;
(e) if the code violation is of the first case, then setting the second pivot bit to correct the end code violation and defining and setting a first correction bit to prevent a violation of the G constraint resulting from setting the middle pivot bit and the first pivot bit of the substring;

(f) if the code violation is of the second case, then defining and setting second correction bit to correct an end code violation and defining and setting a third correction bit to correct the violation of the G constraint within the substring; and (g) moving values of one or more elements overwritten by a pivot or correction bit to element positions corresponding to elements whose values are identified by the pivot bits as being part of a code violation, thereby generating the (N+1)-element codeword corresponding to the N-element dataword.

18. The method of encoding as recited in claim 17, wherein the (N+1) element codeword has elements z(1) through z(N+1); for step (c) the first pivot bit of the left substring, the middle pivot bit, and the first pivot bit of the right substring are defined as elements z(N/2), z((N/2)+1), and z((N/2)+2), respectively; and for step (d), the second pivot bit of the left substring is defined as z((N/8)+1), and the second pivot bit of the right string is defined as z(N-(N/8)+1).

19. The method of encoding as recited in claim 18, wherein, for step (e), if the code violation is of the first case, then the first correction bit of the left substring is defined as z(2+G) and the first correction bit of the right substring is defined as z(N-G); and
  if the code violation is of the second case, then the second and third correction bits of the left substring are defined as z(1) and z(2+G), respectively, and the second and third correction bits of the right substrings are defined as z(N+1) and z(N-G), respectively.

20. The method of encoding as recited in claim 17, wherein for step (b), the code violation of the first case is a string of ((N/8)+1) consecutive values, and the code violation of the second case is a string of ((N/4)+2) consecutive values.

21. The method of encoding as recited in claim 20, wherein, for step (g), the (N+1)-element codeword has the run-length constraints (d, G, l, r), d, l, and r being 0, N/8, and N/8, respectively, and wherein d is a minimum number of consecutive ones, G is a maximum number of consecutive zeros, and l and r are a maximum number of zeros at a left end and a right end of the N+1)-element codeword, respectively.

22. The method of encoding as recited in claim 17, further comprising the steps of setting the middle pivot bit to a first value if the at least one of the left and right substrings contains a code violation; otherwise setting the middle pivot bit to a second value and providing the left and right substrings having the middle pivot bit inserted therebetween as the codeword.

23. The method of encoding as recited in claim 17, wherein, for step b), the value for G is N/4+1.

24. The method of encoding as recited in claim 17, further comprising the steps of:
  d) dividing an additional string of eight elements into left and right nibbles; and
  e) inserting one of the left and right nibbles adjacent to the first pivot bit of the left substring and the other one of the left and right nibbles adjacent to the first pivot bit of the right substring, thereby forming a new codeword having a new G constraint being (N/4)+5.

25. The method of encoding as recited in claim 17, further comprising the steps of converting the sequence of codewords to a signal and providing to the signal to a physical medium.

26. The method of encoding as recited in claim 25, wherein the physical medium is a storage medium, the method further comprising the step of storing the sequence of codewords in the storage medium.

27. The method of encoding as recited in claim 26, wherein, for the step of storing the sequence of (N+1)-codewords, the storage medium is either a magnetic recording medium or a optical recording medium storing data generated by a computer.

28. The method of encoding as recited in claim 25, wherein the physical medium is either a wired, wireless, or optical communications medium, the method further comprising the step of transmitting the signal corresponding to the sequence of codewords through either the wired, wireless, or optical communications medium.

29. The method of encoding as recited in claim 25, wherein, for the step of converting the sequence of codewords into a signal, the signal representing the sequence of codewords has a greater transition density than a signal representing the sequence of datawords.

30. The method of encoding as recited in claim 25, wherein the method provides the signal for increased signal-to-noise ratio to a detector.

31. A method of decoding a sequence of codewords each having at least N+1 elements into a sequence of N-element datawords, the sequence of (N+1)-element codewords received as a signal from a storage or transmission media, the method comprising the steps of:
  a) detecting a middle pivot bit and first and second portions of the codeword, each portion adjacent to the middle pivot bit;
  b) generating the dataword from the first and second portions by:
    if the middle pivot bit is set to one value:
      b1) detecting a set of preserved bits for each portion and a pair of first and second pivot bits;
      b2) generating, for each portion, a substring from the set of preserved elements and, if a second pivot bit is detected in the portion, from at least one code violation defined by the second pivot bit;
      b3) combining each substring to form the dataword;
    otherwise, if the middle pivot bit is set to another value:
      b4) providing the first and second portions as the dataword.

32. The method of decoding as recited in claim 31, wherein the codeword has been formed by the steps of:
  (1) dividing each dataword into left and right substrings by inserting a middle pivot bit therebetween;
  (2) determining whether each of the left and right substrings contains at least one code violation of a first or second case, wherein:
    the first case corresponds to a substring having only an end code violation in which the G constraint would be violated by two adjacent codewords having adjacent end code violations; and
    the second case corresponds to a substring having at least one G constraint violation within the substring;
  (3) if at least one of the left and right substrings has a code violation, then defining a first pivot bit for the left substring and a first pivot bit for the right substring, each first pivot bit adjacent to the middle pivot bit and the pair of first pivot bits indicating whether code violations exist in the left substring only, the right substring only, or both left and right substrings
  (4) if a substring has a code violation, then defining a second pivot bit for the substring, the second pivot bit indicating whether the code violation is of the first case or the second case;

(5) if the code violation is of the first case, then setting the second pivot bit to correct the end code violation and defining and setting a first correction bit to prevent a violation of the G constraint resulting from setting the middle pivot bit and the first pivot bit of the substring;

(6) if the code violation is of the second case, then defining and setting second correction bit to correct an end code violation and defining and setting a third correction bit to correct the violation of the G constraint within the substring; and (i) moving values of one or more elements overwritten by a pivot or correction bit to element positions corresponding to elements whose values are identified by the pivot bits as being part of a code violation, thereby generating the (N+1)-element codeword corresponding to the N-element dataword.

33. An integrated circuit including a circuit for encoding a sequence of N-element datawords into a sequence of codewords each having N+1 elements for storage or transmission such that the sequence of codewords satisfies a G constraint, wherein the G constraint corresponds to a maximum number of elements having the same value and G being (N/4)+1, the circuit comprising:

a storage circuit, coupled to an input stream to receive each dataword, adapted to store each dataword as left and right substrings;

a processor, coupled to the storage circuit, which determines whether each of the left and right substrings contains at least one code violation of either a first or second case, wherein:

the first case corresponds to a substring having only an end code violation in which the G constraint would be violated by two adjacent codewords having adjacent end code violations; and the second case corresponds to a substring having at least one G constraint violation within the substring;

an encoder circuit, coupled to the storage register, adapted to insert a middle pivot bit between the left and right substrings and adapted to encode the dataword into the codeword, wherein, if at least one of the left and right substrings has a code violation, the encoder circuit encodes by defining a first pivot bit for the left substring and a first pivot bit for the right substring, each first pivot bit adjacent to the middle pivot bit and the pair of first pivot bits indicating whether code violations exist in the left substring only, the right substring only, or both left and right substrings, and if a substring has a code violation, the encoder circuit defines a second pivot bit of the substring, the second pivot bit indicating whether the code violation is of the first case or the second case; and wherein the encoder circuit corrects each code violation by:

(i) if the code violation is of the first case, then setting the second pivot bit to correct the end code violation and defining and setting a first correction bit to prevent a violation of the G constraint resulting from setting the middle pivot bit and the first pivot bit of the substring;

(ii) if the code violation is of the second case, then defining and setting second correction bit to correct an end code violation and defining and setting a third correction bit to correct the violation of the G constraint within the substring; and (iii) moving values of one or more elements overwritten by a pivot or correction bit to element positions corresponding to elements whose values are identified by the pivot bits as being part of a code violation, thereby generating the codeword corresponding to the N-element dataword.

34. An integrated circuit including a circuit for decoding a sequence of (N+1)-element codewords into a sequence of N-element datawords, the sequence of (N+1)-element codewords received as a signal from a storage or transmission media, the decoder comprising:

a processor adapted to detect a middle pivot bit and first and second portions of the codeword, each portion adjacent to the middle pivot bit;

a logic circuit, coupled to the processor, adapted to generate the dataword from the first and second portions by:

if the middle pivot bit is set to one value:

1) extracting a set of preserved bits and a first pivot bit for each portion;

2) generating, for each portion, a substring from the set of preserved elements and, if a second pivot bit is detected in the portion, from at least one code violation defined by the second pivot bit;

3) combining each substring to form the dataword;

otherwise, if the middle pivot bit is set to another value, by:

4) providing the first and second portions as the dataword.

35. The invention as recited in claim 34, wherein each (N+1)-element codeword has formed from the corresponding N-element dataword by:

(i) dividing each dataword into left and right substrings by inserting a middle pivot bit therebetween;

(ii) determining whether each of the left and right substrings contains at least one code violation of a first or second case, wherein:

the first case corresponds to a substring having only an end code violation in which the G constraint would be violated by two adjacent codewords having adjacent end code violations; and the second case corresponds to a substring having at least one G constraint violation within the substring;

(iii) if at least one of the left and right substrings has a code violation, then defining a first pivot bit for the left substring and a first pivot bit for the right substring, each first pivot bit adjacent to the middle pivot bit and the pair of first pivot bits indicating whether code violations exist in the left substring only, the right substring only, or both left and right substrings (iv) if a substring has a code violation, then defining a second pivot bit for the substring, the second pivot bit indicating whether the code violation is of the first case or the second case;

(v) if the code violation is of the first case, then setting the second pivot bit to correct the end code violation and defining and setting a first correction bit to prevent a violation of the G constraint resulting from setting the middle pivot bit and the first pivot bit of the substring;

(vi) if the code violation is of the second case, then defining and setting second correction bit to correct an end code violation and defining and setting a third correction bit to correct the violation of the G constraint within the substring; and (vii) moving values of one or more elements overwritten by a pivot or correction bit to element positions corresponding to elements whose values are identified by the pivot bits as being part of a code violation, thereby generating the (N+1)-element codeword corresponding to the N-element dataword.

36. A computer-readable medium having stored thereon a plurality of instructions, the plurality of instructions including instructions which, when executed by a processor, cause the processor to implement a method for encoding a sequence of N-element datawords into a sequence of (N+1)-element codewords for storage or transmission such that the sequence of codewords satisfies a G constraint, wherein the G constraint corresponds to a maximum number of elements having the same value and G being (N/4)+1, the method comprising the steps of:

(a) dividing each dataword into left and right substrings by inserting a middle pivot bit therebetween;

(b) determining whether each of the left and right substrings contains at least one code violation of a first or second case, wherein:
   the first case corresponds to a substring having only an end code violation in which the G constraint would be violated by two adjacent codewords having adjacent end code violations; and
   the second case corresponds to a substring having at least one G constraint violation within the substring;

(c) if at least one of the left and right substrings has a code violation, then defining a first pivot bit for the left substring and a first pivot bit for the right substring, each first pivot bit adjacent to the middle pivot bit and the pair of first pivot bits indicating whether code violations exist in the left substring only, the right substring only, or both left and right substrings (d) if a substring has a code violation, then defining a second pivot bit for the substring, the second pivot bit indicating whether the code violation is of the first case or the second case;

(e) if the code violation is of the first case, then setting the second pivot bit to correct the end code violation and defining and setting a first correction bit to prevent a violation of the G constraint resulting from setting the middle pivot bit and the first pivot bit of the substring;

(f) if the code violation is of the second case, then defining and setting second correction bit to correct an end code violation and defining and setting a third correction bit to correct the violation of the G constraint within the substring; and (g) moving values of one or more elements overwritten by a pivot or correction bit to element positions corresponding to elements whose values are identified by the pivot bits as being part of a code violation, thereby generating the (N+1)-element codeword corresponding to the N-element dataword.

37. A computer-readable medium having stored thereon a plurality of instructions, the plurality of instructions including instructions which, when executed by a processor, cause the processor to implement a method for decoding a sequence of (N+1)-element codewords recorded on a storage media into a sequence of N-element datawords, the method comprising the steps of:

a) detecting a middle pivot bit and first and second portions of the codeword, each portion adjacent to the middle pivot bit;

b) generating the dataword from the first and second portions by:
   if the middle pivot bit is set to one value:
      b1) detecting a set of preserved bits and a first pivot bit for each portion;
      b2) generating, for each portion, a substring from the set of preserved elements and from the at least one code violation defined by the pair of first and second pivot bits
      b3) combining each substring to form the dataword;
   otherwise, if the middle pivot bit is set to another value:
      b4) providing the first and second portions as the dataword.

38. The computer-readable medium as recited in claim 37, wherein the codeword is formed by a method comprising the steps of:

(c) dividing each dataword into left and right substrings by inserting a middle pivot bit therebetween;

(d) determining whether each of the left and right substrings contains at least one code violation of a first or second case, wherein:
   the first case corresponds to a substring having only an end code violation in which the G constraint would be violated by two adjacent codewords having adjacent end code violations; and
   the second case corresponds to a substring having at least one G constraint violation within the substring;

(e) if at least one of the left and right substrings has a code violation, then defining a first pivot bit for the left substring and a first pivot bit for the right substring, each first pivot bit adjacent to the middle pivot bit and the pair of first pivot bits indicating whether code violations exist in the left substring only, the right substring only, or both left and right substrings (f) if a substring has a code violation, then defining a second pivot bit for the substring, the second pivot bit indicating whether the code violation is of the first case or the second case;

(g) if the code violation is of the first case, then setting the second pivot bit to correct the end code violation and defining and setting a first correction bit to prevent a violation of the G constraint resulting from setting the middle pivot bit and the first pivot bit of the substring;

(h) if the code violation is of the second case, then defining and setting second correction bit to correct an end code violation and defining and setting a third correction bit to correct the violation of the G constraint within the substring; and (i) moving values of one or more elements overwritten by a pivot or correction bit to element positions corresponding to elements whose values are identified by the pivot bits as being part of a code violation, thereby generating the (N+1)-element codeword corresponding to the N-element dataword.

* * * * *